United States Patent [19]

Peterson

[11] Patent Number: 5,867,170

[45] Date of Patent: Feb. 2, 1999

[54] COMPOSITE DIGITAL IMAGES

[76] Inventor: Laurence David Peterson, 1334 Parkway Blvd., Brookings, S. Dak. 57006

[21] Appl. No.: 663,671

[22] Filed: Jun. 14, 1996

Related U.S. Application Data

[62] Division of Ser. No. 213,437, Mar. 14, 1994, Pat. No. 5,583,601.

[51] Int. Cl.⁶ ........................................... G06T 5/00
[52] U.S. Cl. ............................................... 345/431
[58] Field of Search .................. 345/431; 396/661; 356/580, 354, 297, 306, 301

[56] References Cited

U.S. PATENT DOCUMENTS 3,337,341  8/1967  Ryan ............................................ 430/15
3,820,874  6/1974  Scarpetti .................................. 395/462
3,940,778  2/1976  Craig et al. .............................. 40/776

*Primary Examiner*—Anton Fetting

[57] ABSTRACT

A process for producing digital color composite images by using digital images produced with a digital camera or from color positive or negative film which have be digitized using a film scanner and subsequently assembling the resulting digital positive and negative images using computergraphics software. These digital composite images when printed, projected or otherwise outputted are useful in the creation and production of artwork for cinematography, graphic arts, signs, advertising, book and magazine illustration, computergraphics, photographic prints as well as photomechanical reproduction such as offset lithography or silk-screen printing.

13 Claims, 1 Drawing Sheet

COMPOSITE DIGITAL IMAGES

This application is a Division of 08/213,437 filed Mar. 14, 1994 now U.S. Pat. No. 558,360.

TECHNICAL FIELD

This invention concerns the production of composite digital images which when printed, projected or otherwise outputted are useful in the creation and production of artwork for photomechanical reproduction and cinematography.

BACKGROUND OF THE INVENTION

Computers and digital cameras are rapidly changing the world of photography. Many of the photographic techniques which previously have been developed for color as well as black-and-white film can be duplicated by digital technology using optical scanners and/or digital cameras in conjunction with computergraphics software.

Most commercial color film, both reversal (positive) film and color print (negative) film is comprised of three emulsion layers, with each forming an image of one of the three primary colors, blue, green and red. Before processing, however, the film is not actually colored. Color is provided by the formation of appropriately colored dyes in each of the three emulsion layers during processing. The formation of the dyes is controlled by complex organic chemicals known as color couplers. Each of the three emulsion layers contains a different color coupler.

Color print film or more precisely, color negative film is negative in two senses. Not only are the light tones in the subject reproduced as dark in the negative, but all colors in the subject are reproduced as their complementaries in this negative. Each of the three primary colors are rendered as their three complementary colors: blue becomes yellow, green becomes magenta, and red becomes cyan. Just as the printing of a black and white negative gives the image its original values, so too does the printing of a color negative. Color printing paper works in a similar way to film and the "print" is simply a negative image of the negative, that is, a positive. In contrast to color print film, color reversal film (also often referred to as color slide film or color transparency film) is designed to make color positive images (color transparencies) when the film is processed by a processing method referred to as Ektachrome Process E-6 or simply shortened to "E-6".

In the typical color reversal film, the latent image, recorded in the three emulsion layers of the film, is developed in complete darkness by the first developer. This produces a negative image comprised of metallic silver which is similar to an ordinary black and white negative. The action of this developer, however, is much more sophisticated. Ultimately, it is responsible for the overall density of the image as well as governing the formation and reproduction of its colors. A brief two or three minute wash follows the first development. The wash removes excess developer and so prevents development from continuing. The next stage is a reversal bath in which the emulsion become laden with a potentially active reversal agent. This activity is triggered by the color developer which follows. Fogging centers form on all the silver halides which were left unexposed by the camera exposure, and were therefore left untouched by the first developer.

The residual silver halide, which is now developable, is converted to a dye image by the color developer. Color couplers contained within the three emulsion layers react with the color developer to produce the yellow component in one layer, the magenta component in another layer, and the cyan component in the third layer. Dye is formed only in those layers where no metallic silver formed during the first development. If one looks at the film at this stage there is no sign of color. All one sees is dense black because the image dyes are still covered by metallic silver. The function of the subsequent processing stages is to remove the silver formed during the first and second development, leaving behind only dyes which combine to form the color positive image.

By making small adjustments to the first development stage it is possible to obtain acceptable transparencies from films which have been exposed at other than the recommended film speed rating. A film knowingly underexposed by one f-stop (ie., exposed as if it were a faster film) can be rescued by increasing the time in the first development stage, e.g., from six to ten minutes (often referred to as "pushing one f-stop"); two f-stops underexposure requires developing an additional minute and a half ("pushing two f-stops"). The limit of correction in the case of overexposure is about one f-stop, achieved by reducing the first development to four minutes (referred to as "pulling one f-stop"). In effect, for film exposed at the manufacturers' recommended film speed rating, "pushing the film one or two stops" in developing tends to make the resulting color positive transparency film appear slightly overexposed. Likewise, by processing the same film by "pulling one stop" would give the resulting color positive transparency film a slightly underexposed appearance.

Normal processing of color print film (the type of film most frequently used by both amateurs and professionals to make color photographic prints) is generally referred to as "C-41 processing". When color print film is processed by the C-41 film processing method, the resulting product is referred to as "color negative film". This color negative film can then by used directly in typical color printing procedures to produce a color photographic print (positive image) which shows the colors as one would have observed them in the original subject matter. If one processes color reversal film by using a C-41 film processing method, then the resulting image is a also color negative image instead of the color positive image which results from the normally recommended E-6 processing.

Further background material relating to color photographic film, development and processing thereof is hereby incorporated by reference:

Reference 1) "Understanding Color Negative Film", The Photo, Vol. 2, pp. 546–547, Marshall Cavendish Corporation, New York (1986).

Reference 2) "Understanding Color Slide Film", The Photo, Vol. 3, pp. 574–575, Marshall Cavendish Corporation, New York (1986).

Reference 3) "Processing Color Slides", The Photo, Vol. 4, pp. 894–895, Marshall Cavendish Corporation, New York (1986).

Reference 4) "Colour Photography", Encyclopaedia Britannica, Vol. 25, pp. 790–792 (1991).

Of all the techniques for creating special effects in the darkroom, few can transform an image more dramatically than those based upon a phenomenon discovered in 1862 by a Frenchman, Armand Sabattier. Sabattier noticed that if a wet collodion plate negative was exposed to light during development, the image was partially reversed and became a positive. Modern photographic film and photographic paper can be reversed similarly, by exposure to light during development. This phenomenon, now known as the "Sabattier effect", is often confused with a similar reversal effect known as "solarization", and indeed, the technique for using the Sabattier effect is sometimes known as "pseudo-solarization". The Sabattier effect and solarization, in effect, produce both a negative and positive image on the same film or paper.

A number of theories have been put forward to explain the Sabattier effect. The most accepted explanation is that the first image that appears on the paper or film forms a mask or stencil. The metallic silver in the shadow areas absorbs much of the light from the second exposure and when white light is turned on, these areas are actually less heavily exposed. The result is that the highlights darken more quickly than the shadows.

An overall fogging exposure by light in the middle of development produces the solarization effect which is characterized by darkening the previously undeveloped areas and reversing some of the color tones. Although solarization and the Sabattier effect look similar, solarization takes place for quite different reasons. Unlike the Sabattier effect, which can only take place during development, solarization is due to excessive exposure at any time. True solarization is very difficult to achieve so photographers generally employ the Sabattier effect since they can get much the same result. The process which involves exposing a print to light during development is relatively uncertain so photographers must do a lot of experimentation on any one photographic print and they find the process very difficult to repeat.

Because of the difficulty in reproducing the Sabattier effect or solarization, it is generally done in black and white since it is less complex than color. However, the Sabattier effect or solarization is even more startling in color. As expected, the results are even less predictable in color than in black and white and the failure rate is very high since there are three emulsion layers in color film, not just one as in black and white. It is possible to solarize color reversal film, unfortunately, the process does not work very well with reversal film material and the cost is generally considered too prohibitive for the amount of experimenting that is needed to find the best combination of development times and fogging exposures (see reference 6 below).

Further background material relating to the Sabattier effect (pseudosolarization) and color solarization is hereby incorporated by reference:

Reference 5) "Understanding Solarization and Sabattier Effects", The Photo, Vol. 3, pp. 754–755, Marshall Cavendish Corporation, New York (1986).

Reference 6) "Simple Sabattier Effects", The Photo, Vol. 5, pp. 1358–1361, Marshall Cavendish Corporation, New York (1986).

Reference 7) "Solarization and the Sabattier Effect", Photography in Focus, M. Jacobs and K. Kokrada, pp. 202–205, National Textbook Company, Lincolnwood, Ill. (1985).

My invention produces an effect which has characteristics similar to that produced by color solarization or the Sabattier Effect. However, with my invention color positive digital images can be produced with a high degree of reproducibility, made with a broad range of color possibilities and a great degree of color density control. Moreover, my invention permits an artist/photographer to create a measurable and calculatable degree of contrast in the resultant composite image. The broad range of color flexibility and greater degree of control greatly reduces the time and cost in producing a color positive image with a "solarization effect" suitable for commercial use in cinematography, signs or for the production of photographic prints or conventional photomechanical reproduction processes for advertising brochures and magazine or book illustrations.

Photographers frequently sandwich (layer or laminate) two photographic film images to produce a photographic montage, which is a combination of two or more different images taken at different times. They may sandwich two different color positive transparency images taken of different subjects exposed on color reversal film which is subsequently processed using the recommended E-6 film processing method. Also, they may sandwich two different color negatives taken of different subjects at different times to achieve a photographic montage effect. In some instances, photographers have sandwiched color positive transparencies with black and white negatives of the same image or black and white positive images with color negatives of the same or substantially the same image (See Reference 8, p 112).

Reference 8) The Book of Special Effects Photography, Michael Langford, Alfred A. Knopf, New York, NY (1981).

Photographers are unable, in practice, to sandwich (layer or laminate) color positive image transparency film in a registered manner with a color negative image transparency film taken of the same subject, or substantially the same subject, since color theory would predict that the combined image would appear substantially black or opaque in as much as the complementary colors in the respective positive and negative images would effectively filter out or absorb most, if not all, of the transmittable white light. Further background information relating to sandwich structures is hereby incorporated by reference:

Reference 9) "Sandwiching", Outstanding Special Effects Photography on a Limited Budget, Jim Zuckerman, Chapter 5, pp. 63–75, Writer's Digest Books, Cincinnati, Ohio (1993).

Therefore, it is unexpected and novel to produce composite images using color positive images in conjunction with color negative images by capturing the same, or substantially the same, subject matter as in the present invention for the purpose of producing color composite digital image computergraphics files which can be printed, projected or otherwise outputted for cinematographic purposes, for subsequent production of a photographic print therefrom, for photomechanical reproduction using offset printing or silk-screen printing.

SUMMARY OF THE INVENTION

The subject invention involves formation of a composite digital image comprised of: 1) a color positive digital image (Image A) produced by capturing a subject by a) exposing (with a camera) color reversal film and developing said film in accordance with manufacturer's recommended film processing method (E-6 film processing system) to produce a color positive image and digitizing said image with a film scanner or b) capturing the subject with a digital camera, and superimposing this positive digital image upon 2) a second color negative digital image (Image B) produced by either a) electronically inverting (reversing) the positive image A using computer software or b) capturing the same, or substantially the same, subject by exposing (with a camera) color reversal film of the tricolor substantive coupling type but instead developing said film in accordance with chemical processing methods recommended by manufacturers of color print film of the tricolor substantive coupler type (C-41 film processing system) to produce a color negative image and subsequently digitizing said image with an electronic film scanner wherein the composite digital image (Image A and Image B) when printed by a digital output device display substantial contrast.

These composite digital images when printed with an output device result in startling images having extremely vivid colors as well as a three dimensional appearance and possessing features similar to those previously achieved only by solarization or pseudo-solarization (Sabattier) techniques. However, and very importantly, compared with any other means of producing such images, the composite digital images of this invention can be made in a very reproducible manner and with a high degree of color control in contrast to the prior art involving solarization or pseudo-solarization (Sabattier) techniques. These composite digital images are useful in projecting images, cinematography (motion picture films), signs, to produce photographic prints, color separations, or in printing with conventional multi-color printing processes such as offset lithography for advertising, magazine or book illustrations, or graphic design.

Important embodiments of the invention involve creating additional contrast by simulating lighting effects in either (or both) the negative and/or positive digital images using the capabilities of existing computergraphics software such as Adobe's Photoshop. Additional embodiments of the invention involve simulating under or overexposure of the either or both the negative and/or positive digital images prior to superimposing them digitally to produce the composite digital image.

Additionally, the color positive image film and color negative image film can be digitized employing available optical film scanning devices and the resulting "digitized images" can then be assembled using computergraphics software to produce a "digital composite image" which can then be employed by using the appropriate computergraphics file formats directly in cinematography, to produce composite film which embodies the image contained in the multi-image sandwich film structure of this invention as well as be used in photomechanical reproduction systems, such as offset lithography for advertising brochures and magazine or book illustration.

DETAILED DESCRIPTION OF THE INVENTION

Figure 1:
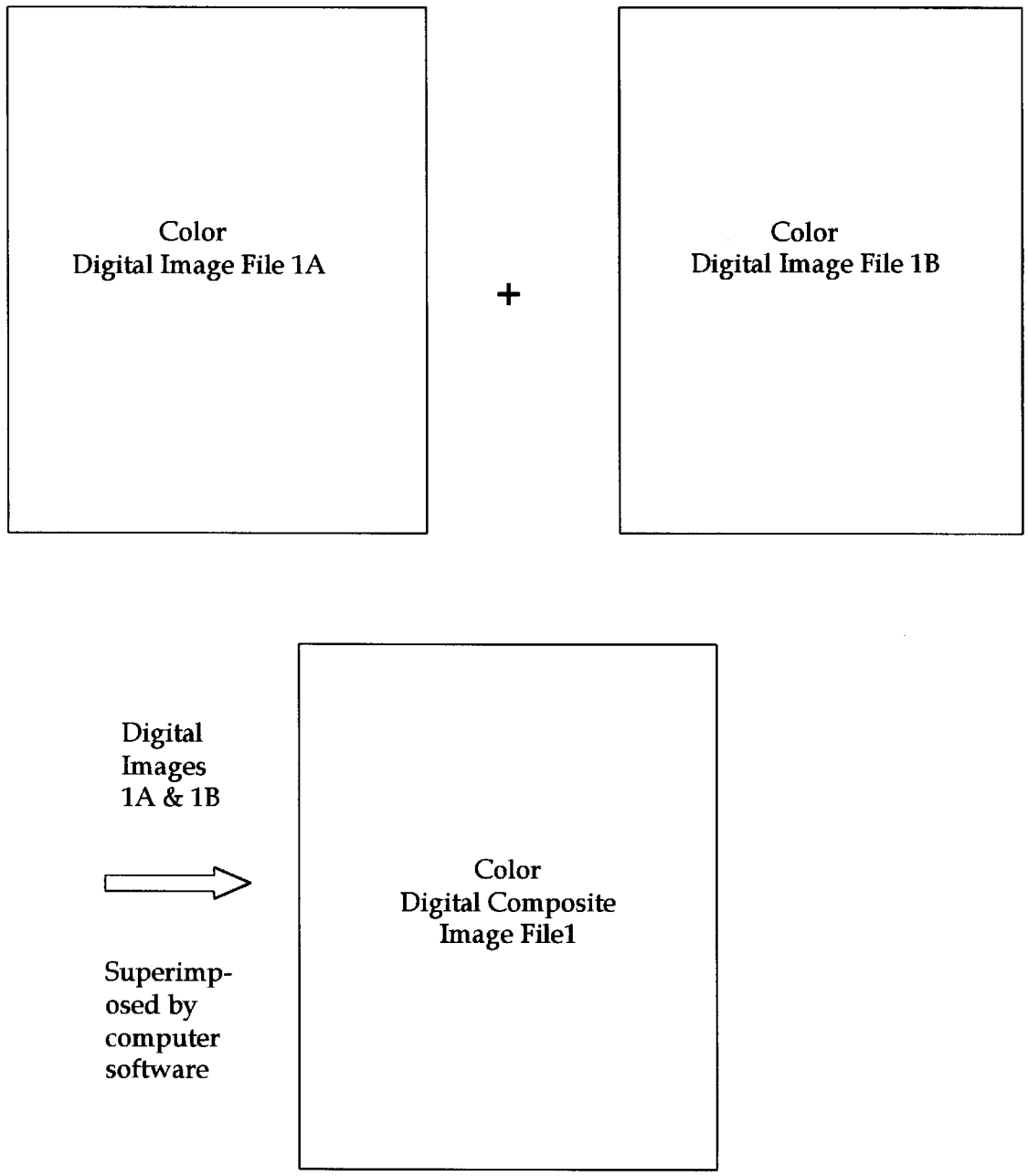
FIG. 1 is a flow chart of the invention.

The preferred embodiment of the invention (Example 1) involved formation of a composite digital image by capturing a subject employing a digital camera to produce a color positive digital image (Image 1A). Using computergraphics software (Adobe's Photoshop), the color positive digital image 1A was converted to a color negative digital image by inversion and the contrast subsequently increased using the computer software to produce a color negative digital image (Image 1B). The two digital images (Image 1A and Image 1B) are then superimposed to produce a composite digital image (Composite Image 1) which, when printed or projected, displayed extremely vivid colors and had a high degree of contrast similar to film images produced using solarization techniques. Composite Image 1 is useful in the production of artwork for cinematography (motion picture film), graphic arts, signs, advertising, book and magazine illustration, computer graphics, color separation, photographic prints as well as photomechanical reproduction such as offset lithography or silkscreen printing.

In another embodiment of the invention (Example 2), a composite digital image was constructed from 1) a color positive digital image produced by capturing a subject employing a camera which exposed at the recommended film rating, a 120 size color reversal film (Kodak Ektachrome 64T Color Reversal Film EPY, (ISO 164)) and developing said film in accordance with manufacturer's recommended film processing method (E-6 processing system) pushed in the development process by 2 f-stops to yield a color positive film image which was subsequently digitized using a digital film scanner to produce a color positive digital image (Image 2a) and 2) a color negative digital image which was produced by capturing substantially the same subject with a camera using Ektachrome 64T Color Reversal Film EPY, (ISO 64) but developing said film by a C-41 film processing chemical system pulled by one-half of an f-stop in processing to yield a color negative film image which was subsequently digitized using a digital film scanner to produce a color negative digital image (Image 2b). The color positive digital image (Image 2a) was then superimposed on the color negative digital image (Image 2b) using computer software (Photoshop) to produce a composite digital image (Composite Image 2) which exhibited very striking features reminiscent of those produced using the Sabattier effect. This composite image is useful as the artwork for cinematography (motion picture film), graphic arts, signs, advertising, book and magazine illustrations, computer graphics, photographic prints as well as for photomechanical reproduction.

A third embodiment of my invention (Example 3) involved formation of a composite digital image constructed from 1) a color positive image film produced by capturing a subject employing a camera which exposed at the recommended film speed rating, a 120 size color reversal film (Fujichrome Velvia RVP (ISO 50)) and said film was developed as recommended by an E-6 film processing method pushed in the development one f-stop (slightly overdeveloped) and subsequently digitized using a digital film scanner to produce color positive digital image (Image 3a) and 2) a color negative digital image (Image 3b) produced by inverting the color positive digital image (Image 3a) using computer software (Photoshop 2.5) and increasing the contrast using the computer software. Again using the computer software, the two color digital images (Image 3a and Image 3b) were superimposed to produce a composite digital image (Composite Image 3). The composite digital image, when printed or projected, displayed striking features reminiscent of color solarization and is useful as artwork for the applications mentioned in Examples 1 and 2.

A fourth embodiment of my invention (Example 4) involved formation a color composite digital image constructed from a color positive digital image (Image 4a)produced by capturing a subject, wherein a green filter was used on the lighting on the left side of the subject and a red filter was used on the lighting on the right side of the subject, employing a digital camera and a color negative digital image (Image 4b)produced by using computer software (Photoshop 2.5) to invert (reverse) the color positive digital image (Image 4a). The two color digital images were subsequently superimposed using computer software (Photoshop 2.5) to produce a composite digital image (Composite Image 4). The resulting composite digital image, when printed or projected, was very striking and is useful in the production of art work for cinematography and photomechanical reproduction for magazine and book illustrations.

The purpose of enhancing the contrast by using lighting or by increasing the contrast of the color negative (or positive)

digital image as described above (Example 2) is to increase the contrast between the color positive image and color negative image. The resultant composite digital image, when printed or projected, possesses an aesthetically more striking image than otherwise obtained. The increase in, or enhancement of, contrast can be achieved in a number of ways; either in the original exposure of the subject or in the subsequent treatment of the digital image with computer software. Both of these techniques can be performed in a very reproducible and controllable manner using computer software.

An fifth embodiment of my invention (Example 5) involved capturing a subject employing a digital camera (Kodak DCS 200 Digital Camera). The digitized image is saved as both a positive image file and a negative image file. Both the positive image computer file and the negative image computer file are imported into computergraphics software (Adobe Photoshop) wherein the contrast between the two digital images can be increased by software manipulation and then the two digital images are subsequently registered and assembled into one digital composite image file (Composite Image 5). This digital composite image file can be utilized directly (or converted to other more appropriate computer file formats) as digital artwork for cinematography, color separation, photographic prints as well as in photomechanical reproduction such as offset lithography. Alternatively, the digital positive image file from the digital camera can be imported by computergraphics software and therein converted to a digital negative image file. The color tones in the digital positive image can be enhanced (contrasted with that of the digital negative image) by software manipulation. Likewise, the color tones in the digital negative image can be lightened or darkened by software manipulation to produce the same type of contrast differences as produced in film processing by pushing the development in E-6 film processing of the positive image and pulling the development in the C-41 film processing of the negative image.

Having described my invention in sufficient detail to enable those skilled in the art to make and use it,

I claim:

1. A process for making composite digital image computergraphics files, which can be printed, projected or otherwise outputted, by:
   a) capturing a subject using a digital camera to produce a color positive digital image file, and
   b) converting said color positive digital image file to a color negative image file using computergraphics software, and
   c) superimposing and assembling said color positive digital image file and said color negative digital image file using computergraphics software.

2. A process for making a composite digital image computergraphics file, which can be printed, projected or otherwise outputted, produced in accordance with claim 1 wherein:
   a) the contrast of the color positive digital image file is increased using computergraphics software, and
   b) the contrast of the color negative digital image file is decreased using computergraphics software, and
   c) superimposing and assembling said color positive digital image file and said color negative digital image file using computergraphics software.

3. A process for making a composite digital image computergraphics file produced in accordance with claim 1 wherein the lighting on the subject in the color positive digital image file is changed significantly from the lighting on the subject in the color negative digital image file using computergraphics software.

4. A motion picture film created by using said composite digital image computergraphics file described in claim 1.

5. A process for making a composite digital image computergraphics file, which can be printed, projected or otherwise outputted, wherein:
   a) a positive digital image file is created by employing a film scanner to digitize a color positive image film, and
   b) said positive digital image file is converted to a negative digital image file using computergraphics software, and
   c) superimposing and assembling said positive digital image file and said negative digital image file using computergraphics software.

6. A process for making a composite digital image computergraphics file in accordance with claim 5 wherein:
   a) a positive digital image file is created by employing a film scanner to digitize a color negative image film.

7. A process for making a composite digital image computergraphics file in accordance with claim 5 wherein:
   a) the contrast of the color positive digital image file is increased using computergraphics software, and
   b) the contrast of the color negative digital image file is decreased using computergraphics software, and
   c) superimposing and assembling said positive digital image file and said negative digital image file using computergraphics software.

8. A process for making a composite digital image computergraphics file produced in accordance with claim 5 wherein the lighting on the subject in the color positive image file is changed significantly from the lighting on the subject in the color negative digital image file using computergraphics software.

9. A motion picture film created by using said color composite image computergraphics file described in claim 5.

10. A process for making a composite digital image computergraphics file, which can be printed, projected or otherwise outputted, wherein:
    a) a positive digital image file is created employing a film scanner to digitize a color positive image film, and
    b) a negative digital image file is created employing a film scanner to digitize a color negative image film produced from capturing substantially the same subject as used to produce the positive image film in (a), and
    c) superimposing and assembling said positive digital image file and said negative digital image file using computergraphics software.

11. A process for making a composite digital image computergraphics file which can be printed, projected or otherwise outputted, produced in accordance with claim 10 wherein:
    a) the contrast of the color positive digital image file is increased using computergraphics software, and
    b) the contrast of the color negative digital image file is decreased using computergraphics software, and
    c) superimposing and assembling said color positive digital image file and said color negative digital image file using computergraphics software.

12. A process for making a composite digital image computergraphics file produced in accordance with claim 10 wherein the lighting on the subject in the color positive digital image file is changed significantly from the lighting on the subject in the color negative digital image file using computergraphics software.

13. A motion picture film created by using said composite digital image computergraphics file described in claim 10.

* * * * *